(12) United States Patent
Lee et al.

(10) Patent No.: US 8,923,467 B2
(45) Date of Patent: Dec. 30, 2014

(54) CLOCK AND DATA RECOVERY USING RECEIVER CLOCK SPREAD SPECTRUM MODULATION AND OFFSET COMPENSATION

(71) Applicant: Rambus Inc., Sunnyvale, CA (US)

(72) Inventors: Hae-Chang Lee, Los Altos, CA (US); Thomas H. Greer, III, Chapel Hill, NC (US); Jade M. Kizer, Windsor, CO (US); Brian S. Leibowitz, San Francisco, CA (US); Mark A. Horowitz, Menlo Park, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 13/674,812

(22) Filed: Nov. 12, 2012

(65) Prior Publication Data

US 2013/0136220 A1 May 30, 2013

Related U.S. Application Data

(63) Continuation of application No. 12/441,003, filed as application No. PCT/US2007/019418 on Sep. 5, 2007, now Pat. No. 8,311,176.

(60) Provisional application No. 60/849,868, filed on Oct. 6, 2006.

(51) Int. Cl.
*H03D 3/24* (2006.01)
*H04L 7/00* (2006.01)
*H04L 7/033* (2006.01)
*H03L 7/093* (2006.01)
*H03L 7/07* (2006.01)

(52) U.S. Cl.
CPC ............ *H04L 7/0012* (2013.01); *H04L 7/0337* (2013.01); *H03L 7/093* (2013.01); *H03L 7/07* (2013.01)
USPC ........... 375/375; 375/340; 375/346; 375/371; 375/374

(58) Field of Classification Search
CPC ..... H03L 7/091; H03L 7/0079; H03L 7/0331; H03L 7/0012
USPC ......... 375/324, 340, 354, 355, 362, 328, 371, 375/373, 375, 376, 346; 327/141, 147, 127, 327/156; 455/260; 702/72; 332/127
See application file for complete search history.

(56) References Cited

U.S. PATENT DOCUMENTS

| | | | |
|---|---|---|---|
| 6,114,973 A * | 9/2000 | Winner et al. | 340/905 |
| 6,732,286 B1 | 5/2004 | Sutardja | |
| 6,914,931 B2 | 7/2005 | Douglas et al. | |
| 6,937,679 B2 * | 8/2005 | Skinner | 375/355 |

(Continued)

OTHER PUBLICATIONS

Lee et al., Improving CDR Performance via Estimation, Feb. 7, 2006, 2pgs.

(Continued)

*Primary Examiner* — Sophia Vlahos
(74) *Attorney, Agent, or Firm* — Morgan, Lewis & Bockius LLP

(57) ABSTRACT

A system and method for performing clock and data recovery. The system sets the phase of a recovered clock signal according to at least three estimates of the rate of change of an offset between the frequency of the data transmitter clock and the frequency of a receiver clock.

20 Claims, 9 Drawing Sheets

(56) References Cited

U.S. PATENT DOCUMENTS

| | | | |
|---|---|---|---|
| 6,965,754 | B2 | 11/2005 | King |
| 7,020,791 | B1 | 3/2006 | Aweya et al. |
| 7,317,361 | B2 | 1/2008 | Duven et al. |
| 7,738,617 | B1 * | 6/2010 | Fortin et al. ............. 375/373 |
| 7,825,706 | B2 | 11/2010 | Smith et al. |
| 2003/0201839 | A1 | 10/2003 | Luo et al. |
| 2006/0267647 | A1 * | 11/2006 | Chang ..................... 327/156 |
| 2007/0024383 | A1 | 2/2007 | Spijker et al. |
| 2008/0070532 | A1 * | 3/2008 | Moffatt et al. ........... 455/226.1 |

OTHER PUBLICATIONS

ISR—PCT/US2007/019418, Feb. 11, 2008, 2pgs.
Aoyama, et al., "3Gbps, 5000ppm Spread Spectrum SerDes PHY with Frequency Tracking Phase Interpolator for Serial ATA", NEC Electronics Corporation, 2003 Symposium on VLSI circuits Digest of Technical Papers. 4 Pages.
EP Communication dated Jul. 19, 2010 in EP Application No. 07837790.0. 4 pages.
EP Communication dated Oct. 17, 2012, re EP Application No. 07837790.0. 4 pages.
EP Response dated Apr. 22, 2013 to the Official Communication of Oct. 17, 2012 in EP Application No. 07837890.0, Includes New Claims (Highlighted and Clear Copies) and a Claim Chart. 38 pages.
EP Response with mail date of Nov. 29, 2010 to the Official Communication dated Jul. 19, 2010 re EP Application No. 07837790.0. 12 Pages.
Lee M.J. Edward et al., "A Second-Order Semi-Digital Clock Recovery Circuit Based on Injection Locking", ISSCC 2003, Session 4, Clock Recovery and Backplane Transceivers, Paper 4.3. 8 Pages.
Lee, Hae-Chang et al., "Burst Mode Packet Receiver Using a Second Order DLL", 2004 Symposium on VLSI Circuits Digest of Technical Papers. 4 Pages.
PCI-SIG, "PCI Express Card Electromechanical Specification," Revision 1.1, Mar. 28, 2005. 90 pages.
PCI-SIG, "PCI Express Base Specification," Revision 1.0, Apr. 29, 2002. 416 pages.
Serial ATA Part Five, "Serial ATA International Organization: Serial ATA Revision 2.5," Oct. 27, 2005, pp. 371-434. 64 pages.
Serial ATA Part Four, "Serial ATA International Organization: Serial ATA Revision 2.5," Oct. 27, 2005, pp. 301-370. 70 pages.
Serial ATA Part One, "Serial ATA International Organization: Serial ATA Revision 2.5," Oct. 27, 2005, pp. 1-100. 100 pages.
Serial ATA Part Seven, "Serial ATA International Organization: Serial ATA Revision 2.5," Oct. 27, 2005, pp. 501-587. 87 pages.
Serial ATA Part Six, "Serial ATA International Organization: Serial ATA Revision 2.5," Oct. 27, 2005, pp. 435-500. 66 pages.
Serial ATA Part Three, "Serial ATA International Organization: Serial ATA Revision 2.5," Oct. 27, 2005, pp. 201-300. 100 pages.
Serial ATA Part Two, "Serial ATA International Organization: Serial ATA Revision 2.5," Oct. 27, 2005, pp. 101-200. 100 pages.
Serial ATA, "Serial ATA II: Electrical Specification," Revision 1.0, May 26, 2004. 187 pages.
Serial ATA, "Serial ATA: High Speed Serialized AT Attachment," Revision 1.0a, Jan. 7, 2003. 311 pages.
Sidiropoulos, Stefanos et al., "A Semidigital Dual Delay-Locked Loop", IEEE Journal of Solid-State Circuits, vol. 32, No. 11, Nov. 1997. 10 Pages.
EP Examination Report dated Apr. 17, 2014 in EP Application No. 07837790.0. 5 pages.

* cited by examiner

TX

RX

FREQ OFFSET B/W TX AND RX

FIG. 7

CLOCK AND DATA RECOVERY USING RECEIVER CLOCK SPREAD SPECTRUM MODULATION AND OFFSET COMPENSATION

CROSS-REFERENCE TO RELATED APPLICATIONS

This application is a continuation of U.S. patent application Ser. No. 12/441,003, filed Mar. 12, 2009, now U.S. Pat. No. 8,311,176, which is a national phase application filed under 35 U.S.C. 371, International Application No. PCT/US2007/19418, filed Sep. 5, 2007, which claims the benefit of the filing date of U.S. Provisional Patent Application No. 60/849,868 filed Oct. 6, 2006, each of which is hereby incorporated herein by reference in their entirety.

BACKGROUND

Modern digital systems typically include multiple digital devices capable of communicating with each other using digital signals made of sequences of digital symbols. A digital symbol takes up a time interval, which is often referred to as a unit interval or a data interval. A digital device may transmit a digital data signal by setting the value of a signal parameter associated with a communication channel to one of a plurality of predetermined values for each data interval according to a transmitter clock. A digital device that receives the digital signal takes successive samples of the signal according to a receiver clock and determines the values of the signal parameter represented by the samples. The receiver clock is preferably synchronized with the digital signal so that the samples are taken at times corresponding to the bit intervals To communicate data at high speed, it is desirable to make the data intervals as short as possible, which, in turn, requires greater precision in the synchronization between the receiver clock used by the receiving device and the data intervals of the incoming signal. For example, modern interfacing and communication protocols such as PCI Express, SONET, InfiniBand and XAUI use data intervals on the order of nanoseconds or less, and require that the receiving device use a clock which is synchronized to the data intervals to within a fraction of one data interval. For ease of synchronization, many digital systems are designed such that the transmitter clock and the receiver clock both have a relatively stable frequency. However, such systems may be susceptible to electromagnetic interference (EMI) at or near a particular frequency, and may interfere with other systems that are sensitive to signals at or near the particular frequency.

BRIEF DESCRIPTIONS OF THE DRAWINGS

The following detailed description given by way of example, but not intended to limit the invention solely to the specific embodiments described, may best be understood in conjunction with the accompanying drawings wherein like reference numerals denote like elements and parts, in which:

FIG. 7 is a functional block diagram of a clock recovery circuit in accordance with a third embodiment of the present system and method.

DETAILED DESCRIPTION

To reduce EMI, a digital system may employ a clock signal having a frequency that varies over time. That is, the digital system may impart a frequency modulation to a transmitter and/or receiver clock in the digital system. By varying the frequency of a clock signal, the spectrum of the clock signal is spread out over a frequency band so that the clock signal does not give rise to EMI that is concentrated at a particular frequency. Therefore, a signal with a narrow frequency band that is within the frequency band of the spread spectrum clock signal may be more easily discernable than it would be if the spectrum of the clock signal were concentrated at the same frequency as the narrowband signal. Moreover, spreading the spectrum of the clock signal makes it less likely for a narrowband signal in the clock signal's frequency band to significantly interfere with the clock signal.

Figure 1:
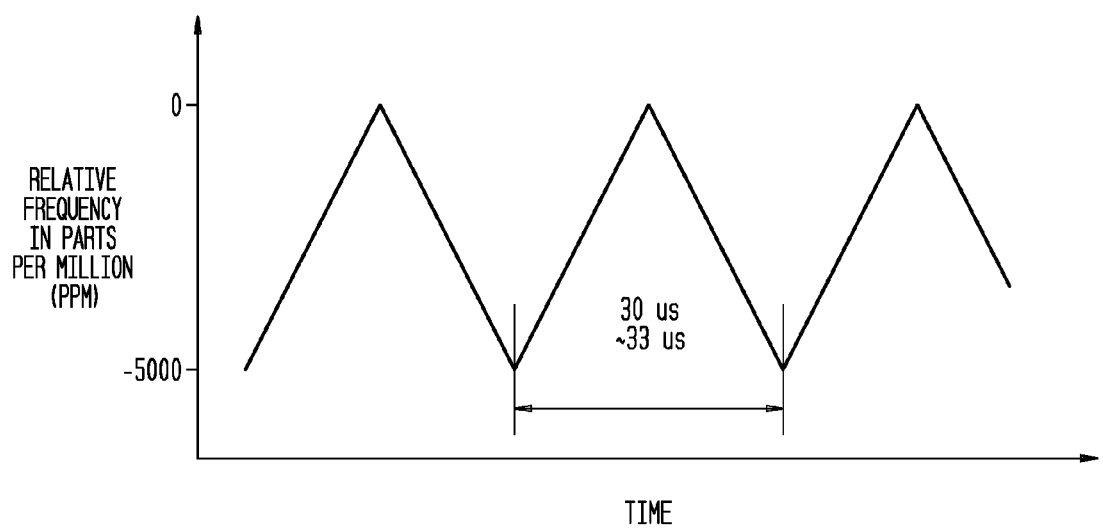
FIG. 1 is a graph showing a triangular frequency modulation that may be applied to a clock signal.

One way in which a spread spectrum clock signal is generated is by application of a triangular frequency modulation to the clock signal. FIG. 1 is a graph showing a triangular frequency modulation that may be applied to a clock signal. In FIG. 1, the frequency varies from a peak frequency to a frequency that is lower than the peak frequency by 5000 ppm (parts per million). The modulation is periodic and has a period in the range of 30 μs-33 μs.

In the case of modulating only one of a transmitter and receiver clock according to the modulation in FIG. 1 and maintaining the other clock at the peak frequency, the modulation shown in FIG. 1 also represents the frequency offset over time between the transmitter clock and the receiver clock. In any event, the triangular frequency modulation shown in FIG. 1 is merely illustrative.

In one embodiment of the present system and method, a frequency modulation is imparted to the transmitter clock and to the receiver clock such that the frequency offset between the transmitter clock and the receiver clock, and thereby the frequency offset between the transmitted data signal and the receiver clock, exhibits a trapezoidal waveform pattern. To illustrate how such trapezoidal frequency offset is achieved, reference is made to FIGS. 2A, 2B, and 2C.

Figure 2A:
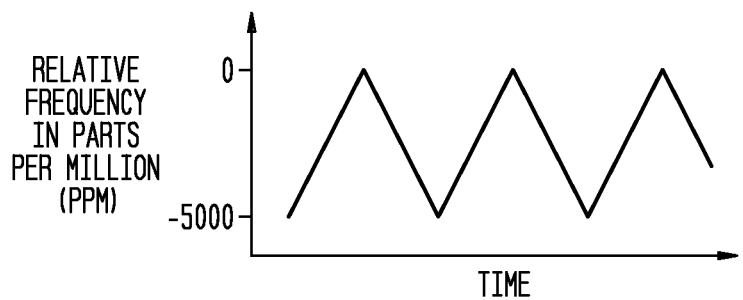
FIG. 2A is a graph showing a triangular frequency modulation as applied to a transmitter clock.
Figure 2B:
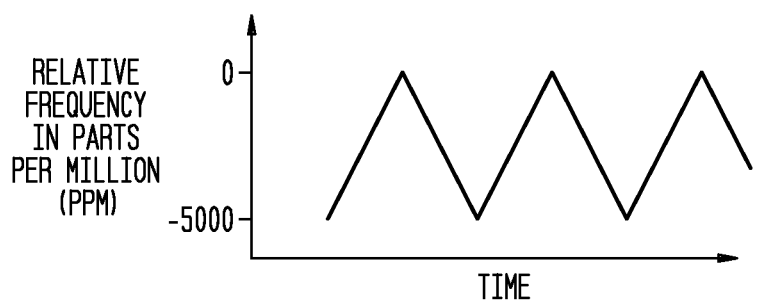
FIG. 2B is a graph showing a triangular frequency modulation as applied to a receiver clock.
Figure 2C:
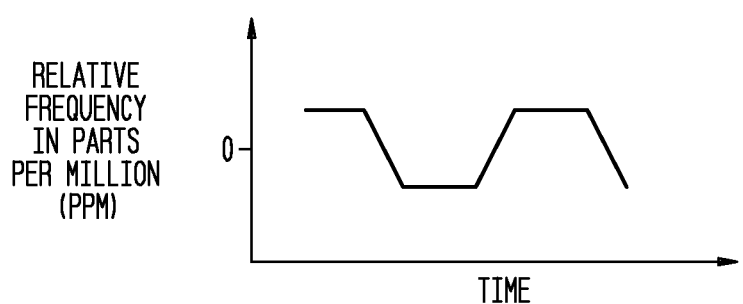
FIG. 2C is a graph showing the frequency offset waveform between a transmitter clock that is modulated as shown in FIG. 2A and a receiver clock that is modulated as shown in FIG. 2B.

FIG. 2A is a graph showing a triangular frequency modulation as applied to a transmitter clock. FIG. 2B is a graph showing a triangular frequency modulation as applied to a receiver clock. When the modulations depicted in FIGS. 2A and 2B are offset from each other in time (as shown), the effective frequency offset between the transmitter clock and the receiver clock traces a trapezoidal waveform. FIG. 2C is a graph showing the frequency offset between a transmitter clock that is modulated as shown in FIG. 2A and a receiver clock that is modulated as shown in FIG. 2B.

For purposes of this description, embodiments of the present system and method will be described in the context of the trapezoidal frequency offset depicted in FIG. 2C. However, in view of this description those skilled in the art will readily appreciate the wide range of frequency offset waveforms to which the present system and method can be applied. For example, a modulation having a more complex shape than a triangular waveform may be applied to the transmitter or receiver clock, thereby resulting in a frequency offset waveform that has a more complex shape than a triangular or trapezoidal waveform.

Figure 3:
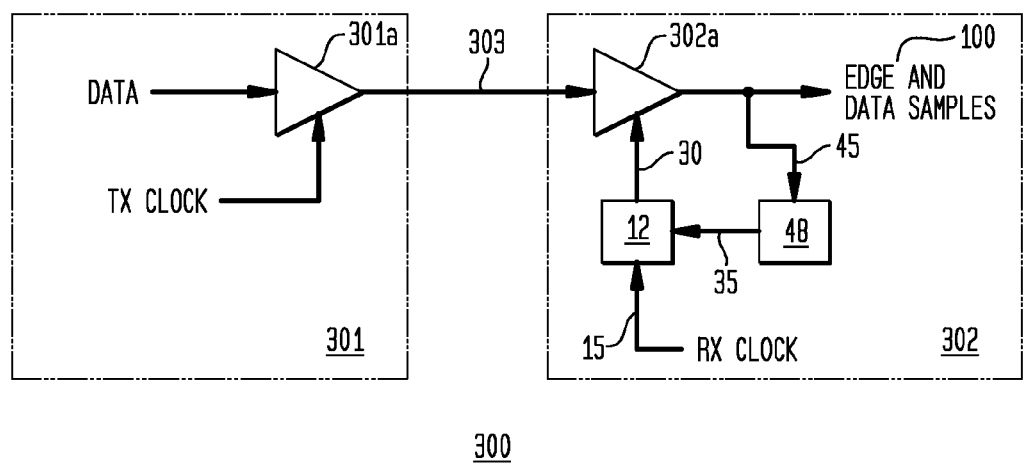
FIG. 3 is a block diagram illustrating a communication system having frequency modulation applied to either or both of a transmitter clock and a receiver clock.

FIG. 3 illustrates a communication system 300 having a data transmitting device 301 and a data receiving 302 device coupled via a communication channel 303. The data transmitting device 301 includes at least one transmitter 301a that sends a data signal to the communication channel 303 according to a transmitter clock (TX Clock), and the data receiving device 302 includes at least one receiver 302a that receives the data signal according to at least one clock signal 30 generated from a receiver clock (RX Clock) 15. In one embodiment, frequency modulation is applied to either or both of the TX and RX clocks to impart a frequency offset between the TX and RX clocks that varies over time.

The receiving device 302 further includes a clock recovery circuit 100 to generate the at least one recovered clock signal 30. In one embodiment, the clock recovery circuit includes a feedback circuit 48 that generates a control signal 35 and a clock generating circuit 12 that generates the at least one recovered clock signal 30 from the receiver clock 15 according to the control signal 35.

The clock recovery circuit 100 according to one embodiment uses piece-wise linear (PWL) estimation of a periodic frequency offset waveform. The waveform is considered to traverse a plurality of segments ("N" segments) in a period of the waveform, with a ramp rate being associated with each segment. The number "N" of segments in a period may depend on the complexity of the waveform. The ramp rates of the respective segments are used to track the phase movement of the data signal and are free to vary on a segment-by-segment basis. The ramp rate associated with a particular segment is equal to the derivative of the frequency offset for the respective segment. The ramp rates may be updated iteratively. For example, each time the frequency offset waveform enters a new segment, a previously generated estimate of the ramp rate for the segment is used as an initial ramp rate value for the segment. As the waveform traverses the segment during a given period (or "iteration"), the ramp rate value for that segment is refined and the estimate for the ramp rate determined at the end of the segment is used as the initial ramp rate value for the same segment during a succeeding iteration.

Figure 4:
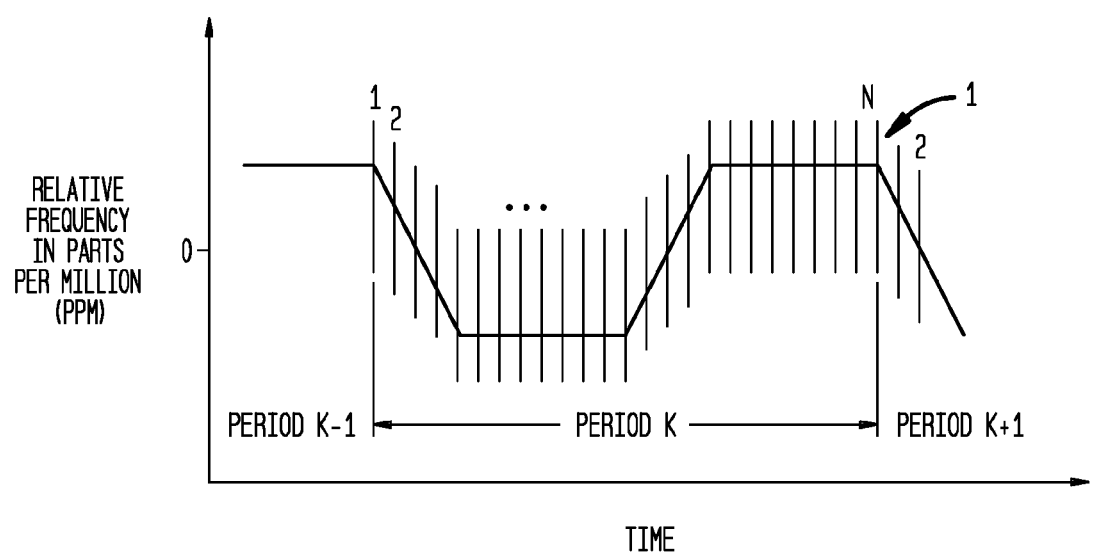
FIG. 4 is a graph showing the frequency offset waveform over time between a transmitter clock modulated as shown in FIG. 2A and a receiver clock modulated as shown in FIG. 2B, and showing the partitioning of one period of the offset waveform into "N" segments.

FIG. 4 is a graph illustrating how a period of the frequency offset waveform depicted in FIG. 2C is partitioned into "N" segments in accordance with an embodiment. In particular, the figure depicts the segmentation of a period "K" of the frequency offset waveform. A period "K−1" precedes period "K" and a period "K+1" succeeds period "K." The segmentation depicted in FIG. 4 is the segmentation referred to in connection with the following description of the embodiments of FIGS. 5-8.

Figure 5:
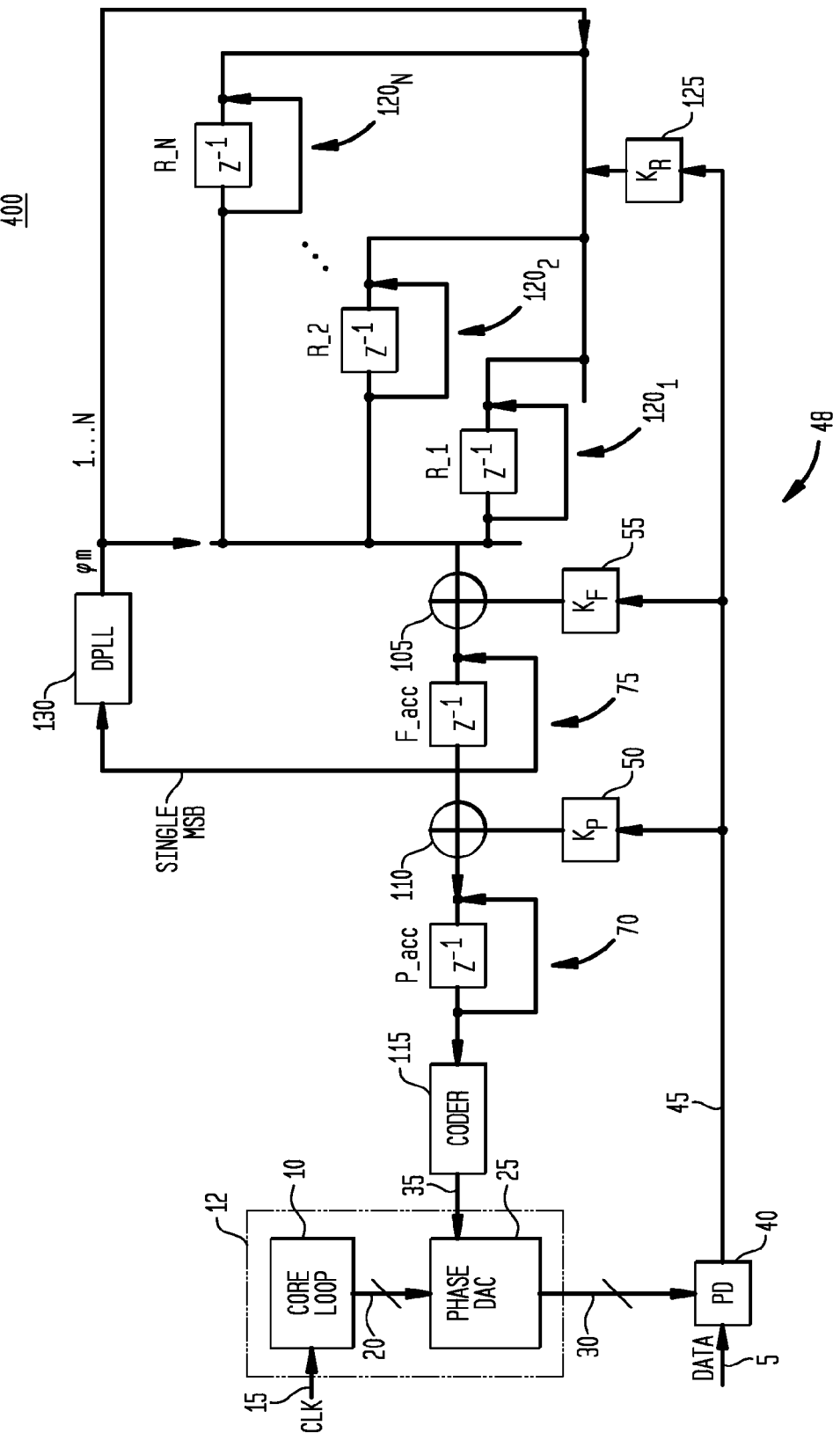
FIG. 5 is a functional block diagram of a clock recovery circuit in accordance with a first embodiment of the present system and method.

Referring now to FIG. 5, there is shown a functional block diagram of a clock recovery circuit 400 in accordance with a first embodiment of the present system and method. Clock recovery circuit 400 corresponds to clock recover circuit 100 of FIG. 3. As can be seen from FIG. 5, the circuit 400 includes a clock generating circuit 12 to generate at least one recovered clock signal 30 from a receiver clock signal 15. In one embodiment, the clock generating circuit includes a core loop 10 that generates a multiple of core signals 20 according to the receiver clock signal 15, and a phase digital-to-analog converter (phase DAC) 25 to generate a multiple of recovered clock signals 30 from the core signals. The core loop 10 may include a multi-phase phase locked loop (not shown) to generate the core signals 20 as periodic signals having the same frequency as the receiver clock signal but varying in phase from signal-to-signal. The core signals are passed to the phase DAC 25, which uses the core signals to generate the recovered clock signals 30 according to a digital phase estimation signal 35. The recovered clock signals have fine phase resolution and are periodic signals used to sample the data 5 at its transitions (for timing recovery) and at its midpoints (for data recovery). Since the recovered clock signals 30 are collectively operable to sample the incoming data 5 in the same way that a clock synchronous with the data would sample the data, the recovered clock signals are said to collectively make up a single "recovered clock."

It is noted that the core signals 20 and recovered clock signals 30 are analog signals, and that the digital phase estimation signal 35 is passed to the phase DAC via a digital bus. In this regard, the digital phase estimation signal is used in conjunction with the core signals to generate recovered clock signals that correspond to the circuit's estimation of the phase of the incoming data. Thus, it is said that the phase DAC "converts" the digital phase estimation signal 35 from a digital phase to an analog phase. In one embodiment, the phase DAC is a phase shifter that shifts the phase of the core signals 20 in response to the phase estimation signal 35. The phase shifter may be implemented through use of a phase interpolator and/or variable delay line.

The recovered clock signals 30 generated by the phase DAC 25 are passed to a phase detector (PD) 40, which samples the incoming data 5 with the recovered clock signals to recover data and to generate a phase error signal 45, the phase error signal indicating whether the recovered clock signals are relatively early, relatively late, or closely aligned with respect to the incoming data signal.

The phase error signal 45 is, in turn, passed through feedback circuitry 48 that uses the phase error signal 45 to generate a value, by which the digital phase estimation signal is updated to better align the digital phase estimation signal 35 with the incoming data signal.

The feedback circuitry 48 through which the phase error signal 45 is passed includes multiplication blocks 50, 55, and 125. The multiplication blocks 50, 55, and 125 multiply the phase error signal by respective mathematical constants "$K_P$," "$K_F$," and "$K_R$". The feedback circuitry 48 further includes an accumulator 70 associated with the multiplication block 50, an accumulator 75 associated with the multiplication block 55, and accumulators $120_1$ through $120_N$ associated with the multiplication block 125. Each accumulator includes a delay element ($Z^{-1}$) having its output fed back to its input such that the element's output signal is added to the element's input signal and the result is stored as the new element output signal. In one embodiment, the accumulators are implemented as clocked storage elements.

Accumulator 70 is designated as a "phase accumulator" because its output is proportional to the difference between the phase of the incoming data signal 5 and the phase of the receiver clock signal 15 when the system is in lock. Accumulator 75 is designated the "frequency accumulator" because its output is proportional to the difference between the frequency of the incoming data signal and the frequency of the receiver clock signal when the system is in lock. Accumulators $120_1$-$120_N$ are designated "rate accumulators" because, when the system is in lock, each accumulator's output is proportional to the rate of change of the frequency offset between the incoming data signal and the receiver clock signal for the accumulator's respective time segment.

It should be noted that in the context of the present system and method, the term "in lock" means that the phase of the recovered clock is tracking the phase of the incoming data signal, as determined by the transmitter clock, such that the recovered clock correctly samples the incoming data. That is, the recovered clock is in synchronism with the data intervals of the incoming data.

Referring again to FIG. 5, it can be seen that the circuit 400 includes "N" rate accumulators (accumulators $120_1$, $120_2$ . . . $120_N$), one for each segment of the frequency offset waveform. The phase error signal is supplied to the input of each of the rate accumulators $120_1$-$120_N$ via the multiplication block 125 which multiplies the phase error 45 by a constant "$K_R$." As the frequency offset waveform enters a segment, the rate accumulator corresponding to the segment is switched into the circuit and the remaining rate accumulators are switched out of the circuit. Thus, at any given point in the offset waveform only one of the accumulators $120_1$, $120_2$ . . . $120_N$ is coupled to summer 105, and to the output of multiplier 125. All other rate accumulator inputs are connected to zero so that each of these accumulators retains its accumulated value during the time it is switched out of the circuit and until it is switched back into the circuit during the next iteration. Thus, each time an accumulator is switched back into the circuit the accumulator's initial value will be the value the accumulator had stored at the time it was switched out of the circuit during the prior iteration.

In one embodiment, a single most significant bit (MSB) of the frequency accumulator 75 represents an estimate of the polarity of the frequency offset. The MSB is a "0" when frequency offset is negative and a "1" when it is positive. Thereby, the MSB produces a square wave having the same period as the trapezoidal waveform of FIG. 2C and tracks the phase of the trapezoidal waveform of FIG. 2C. The clock recovery circuit 400 further includes a digital phase locked loop (DPLL) 130 to synchronize the switching amongst accumulators $120_1$-$120_N$ with the frequency offset waveform. The MSB of the frequency accumulator 75 is a square wave that is input to the DPLL 130.

Figure 5A:
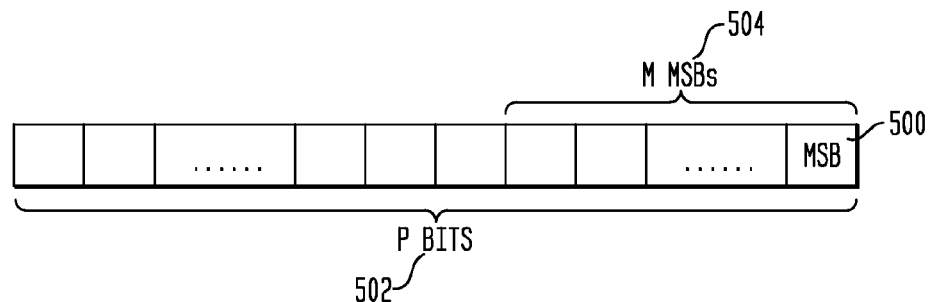
FIG. 5A shows an example of a data structure suitable for use in the present system and method.

FIG. 5A shows an example of a data structure for the phase accumulator output of DPLL 130. As can be seen from FIG. 5B, the result includes a most significant bit (MSB) 500. The output of the DPLL includes a plurality of bits ("P" bits) 502 and a plurality of most significant bits ("M" MSBs) 504 among the plurality of "P" bits, wherein M<P. Thus, MSB 500 is the most significant of the "M" MSBs. Accordingly, the most significant bit of the DPLL output is a square wave that matches the square wave at the input of the DPLL in phase and frequency. In this manner, the most significant bit of the DPLL output is a square wave that is at a logic level "0" when the frequency offset is negative and a logic level "1" when the frequency offset is positive. Thus, DPLL 130 is phase locked to the frequency offset waveform as provided from accumulator 75.

Figure 5B:
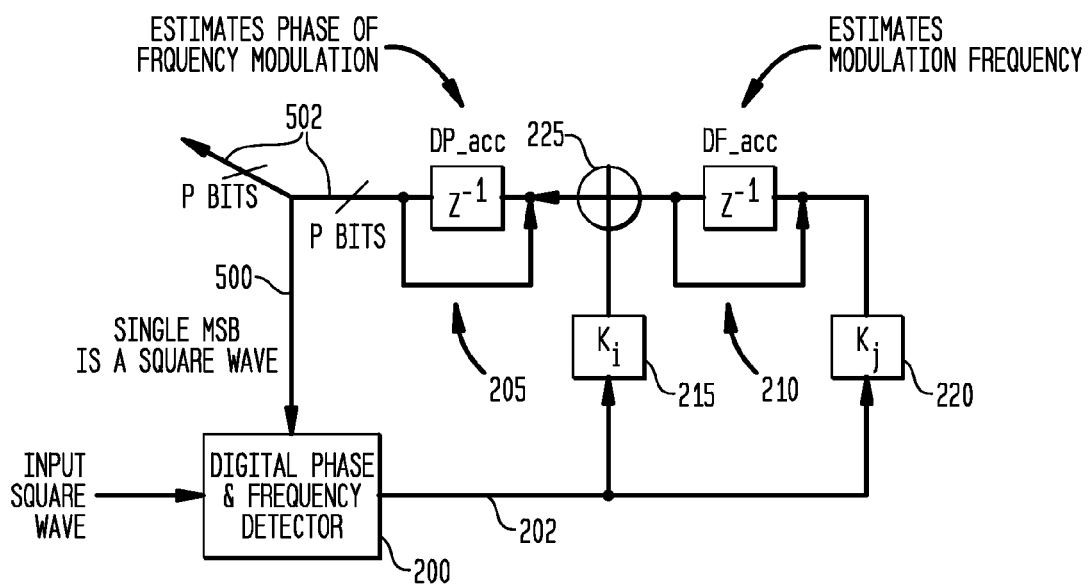
FIG. 5B is a functional block diagram of a digital phase locked loop (DPLL) suitable for use in the present system and method.

An embodiment of DPLL 130 is shown in FIG. 5B. As can be seen from FIG. 5B, the DPLL includes a digital phase and frequency detector 200, a digital phase accumulator 205, a digital frequency accumulator 210, multipliers 215 and 220, and an adder 225. The inputs to detector 200 are the MSB of the frequency accumulator 75 and the MSB 500 of digital phase accumulator 205. The output of the digital phase accumulator 205 is the same as the output of the DPLL 130. The digital phase and frequency detector 200 compares the input of the DPLL to the first MSB 500 of the output of the digital phase accumulator 205 to generate a phase error signal 202 which is input to multipliers 215 and 220. Multiplier 220 multiplies the phase error signal 202 by a constant "$K_j$" and outputs the multiplied value to the digital frequency accumulator 210. Multiplier 215 multiplies the phase error signal 202 by a constant "$K_i$" and outputs the multiplied value to the adder 225. Adder 225 adds the output of multiplier 215 to the output of the digital frequency accumulator 210 and passes the result to the digital phase accumulator 205. In this manner, the DPLL tracks the phase of the frequency offset waveform (e.g. the waveform of FIG. 2C). Since the DPLL's phase accumulator 205 traverses between "0" and its maximum binary code in a time equal to the period of the frequency offset waveform, the most significant bits (MSBs) 504 of the phase accumulator's binary code can be observed to determine when one of the "N" segments of the waveform ends and the next segment of the waveform begins. For example, if 256 segments are to be used (N=256), the 8 MSBs of the DPLL phase accumulator's binary code can be observed to determine when one segment ends and the next segment begins. That is, each change of an MSB indicates a segment change. In general, when the MSBs of the phase accumulator's binary code are to be used for switching synchronization, the number "M" of the MSBs that must be monitored is related to the number of segments by the following equation: M=$Log_2$ N (where "M" is the number of MSBs that must be monitored and "N" is the number of segments). In this manner, the switching amongst accumulators $120_1$-$120_N$ can be keyed to these MSBs to insure that for a given segment the corresponding one of the rate accumulators $120_1$-$120_N$ is switched into the circuit.

Referring back to FIG. 5, summer 105 adds the output of the selected rate accumulator $120_1$, $120_2$, . . . , or $120_N$ to the output of multiplication block 55.

The output of summer 105 is passed to accumulator 75. The output of accumulator 75 is, in turn, passed to a summer 110 which adds the output of accumulator 75 to the output of multiplication block 50. The output of summer 110 serves as the input to accumulator 70.

The output of accumulator 70 is a binary number proportional to the difference between the phase of the incoming data signal and the phase of the receiver clock signal (equivalently the core signals) when the system is in lock. It is an indication of how the phase of the recovered clock should be adjusted (in relation to the receiver clock) to match the phase of the incoming data. The output of accumulator 70 is passed to a coder 115. The coder encodes the binary output of accumulator 70 into a format that is compatible with the phase DAC. The output of the coder is the digital phase estimation signal 35.

Figure 6:
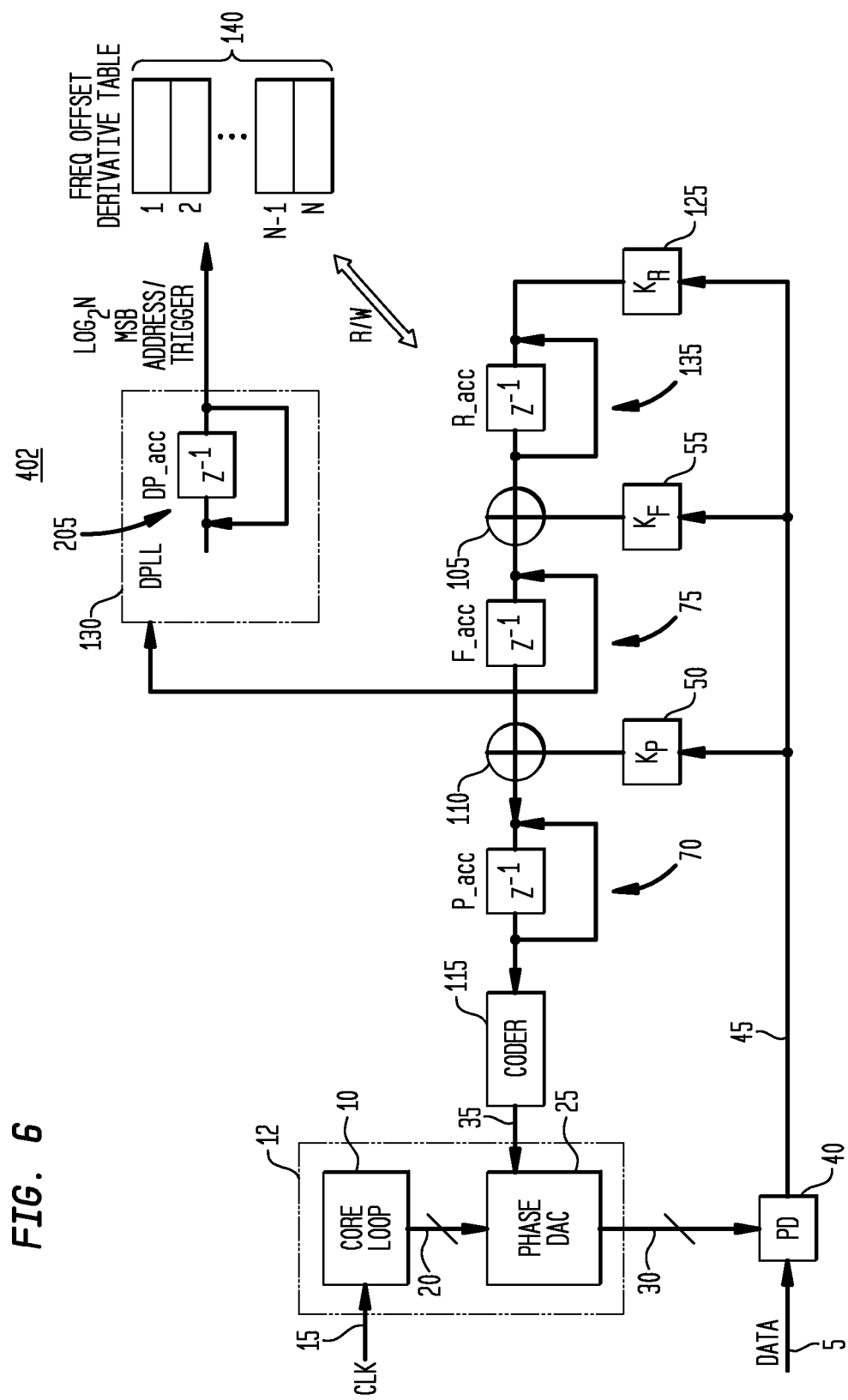
FIG. 6 is a functional block diagram of a clock recovery circuit in accordance with a second embodiment of the present system and method.

Referring now to FIG. 6, there is shown a functional block diagram of a clock recovery circuit 402 in accordance with a second embodiment of the present system and method. Clock recovery circuit 402 corresponds to clock recover circuit 100 of FIG. 3. In the FIG. 6 embodiment, a single rate accumulator 135 is used in conjunction with a frequency offset derivative table 140. The frequency offset derivative table is a data table that is stored in a memory of the circuit. It includes "N" entries, one for each segment of the frequency offset waveform. The "N" entries are the respective last-known-estimates of the ramp rates (frequency offset derivatives) for the "N" segments of the frequency offset waveform. Each time a new segment of the waveform is entered the previously stored last-known-estimate of the ramp rate for that segment is written from the frequency offset derivative table to the rate accumulator 135. The last-known-estimate that has been loaded from the table is then used as the initial value of accumulator 135 for the segment. Upon completion of the segment, the table entry for the segment is updated by overwriting the frequency offset derivative table entry for the segment with the current rate accumulator value. In this manner, the initial accumulator value for the segment during the following iteration is set to the final accumulator value for the segment during the current iteration. Thereby, the ramp rate estimate for each segment is improved over time.

The read/write accesses of the frequency offset derivative table must be synchronized with the frequency offset waveform. Such synchronization is achieved through the use of DPLL 130 having a digital phase accumulator 205. As in the case of the FIG. 5 embodiment, the MSBs of the DPLL phase accumulator's binary code are observed to determine when one segment ends and the next segment begins. In the FIG. 6 embodiment, a change in an MSB indicates that the rate accumulator value for the ending segment should be written from the accumulator to the frequency offset derivative table and that the last-known-estimate for the beginning segment should be written from the frequency offset derivative table to the accumulator. When the MSBs of the phase accumulator's binary code are to be used for switching synchronization, the number of MSBs that must be monitored is related to the number of segments by the following equation: $M = \log_2 N$ (where "M" is the number of MSBs that must be monitored and "N" is the number of segments). For example, if 256 segments are to be used (N=256), 8 MSBs ($\log_2 256$) of the accumulator's binary code must be observed. A decoder (not shown) converts the binary signals to a code that is appropriate for selecting memory entries for reading and writing.

A respective circuit element in FIG. 6 that also appears in FIG. 5 may perform the same function in each of the embodiments illustrated in FIG. 5 and FIG. 6.

Figure 7:
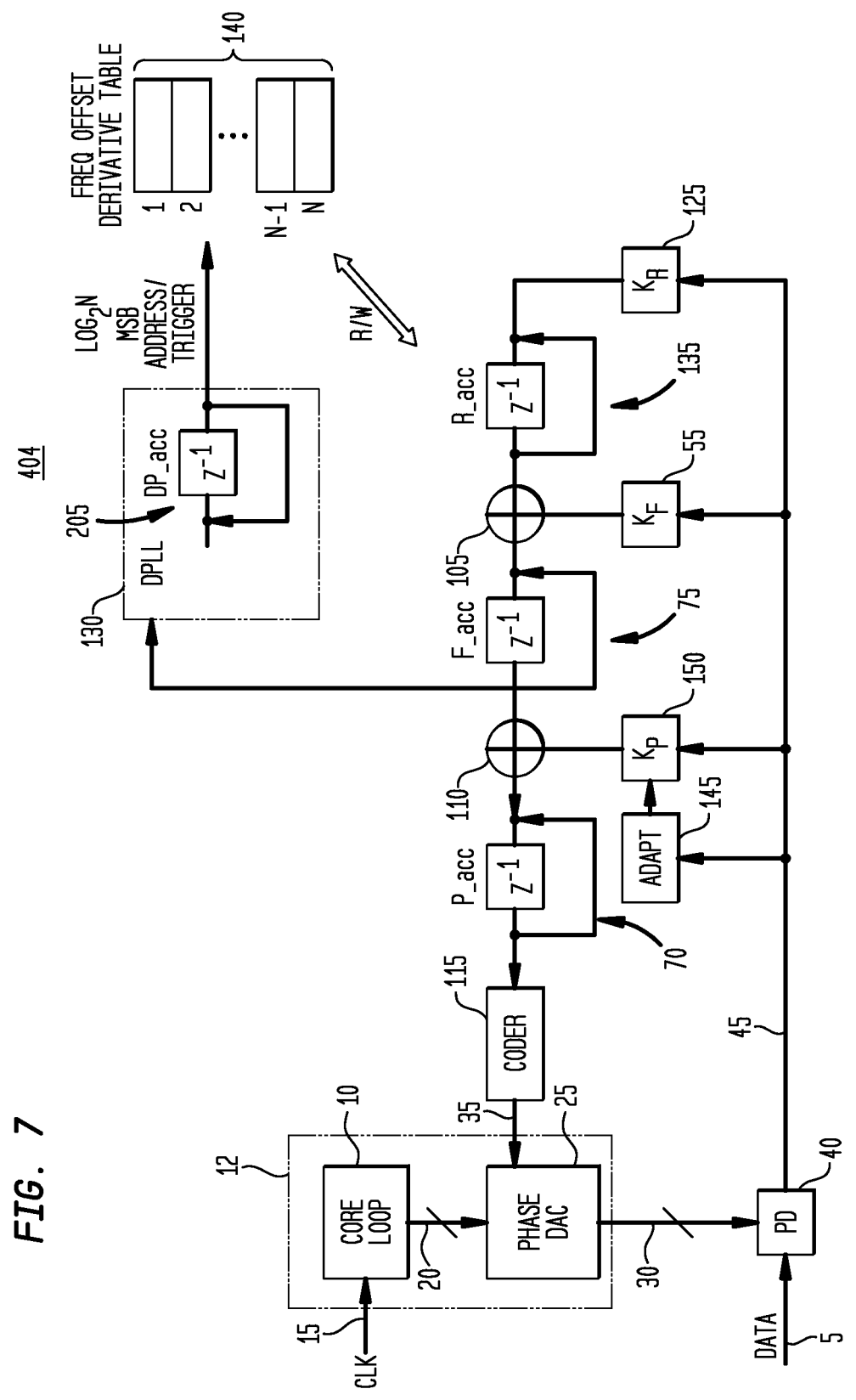

Referring now to FIG. 7, there is shown a functional block diagram of a clock recovery circuit 404 in accordance with a third embodiment of the present system and method. Clock recovery circuit 404 corresponds to clock recover circuit 100 of FIG. 3. The embodiment of FIG. 7 is similar to the embodiment of FIG. 6, the exceptions being that an adaptation block 145 has been added and the multiplication block 50 of FIG. 6 has been replaced by a multiplication block 150 that is responsive to the adaptation block 145. The adaptation block is a device for varying the value of the constant "$K_P$," the constant by which the multiplication block 150 multiplies the phase error signal. For instance, the adaptation block may send a signal to the multiplication block to increase the value of "$K_P$" when a non-lock condition is detected by the adaptation block. Such an increase in the value of "$K_P$" has the effect of increasing the tracking bandwidth of the phase accumulator loop formed by phase detector 40, multiplier 150, adder 110, phase accumulator 70, coder 115, and phase DAC 25 so that the circuit 404 can lock onto the data signal phase before the ramp rate estimates have been properly determined. After the circuit is locked, the ramp rate estimates eventually settle to their proper values, and the adaptation block may then lower the value of "$K_P$" to reduce the amount of phase noise contributed by the phase accumulator loop. The existence of this tradeoff between tracking bandwidth and phase noise in the phase accumulator loop is well known to those skilled in the art.

In an alternative embodiment, the adaptation block may vary "$K_F$" instead of, or in addition to, "$K_P$."

One way in which the adaptation block can detect a non-lock condition is by monitoring the time history of the phase error signal. A monotonic phase error signal indicates a non-lock condition. Another way in which the adaptation block can detect a non-lock condition is by monitoring the DPLL 130. If the DPLL 130 is out of lock, then the clock recovery circuit 404 is out of lock. In view of the present disclosure, one skilled in the art will readily appreciate the many alternative techniques by which the adaptation block can detect the lock condition.

A respective circuit element in FIG. 7 that also appears in FIGS. 5 and 6 may perform the same function in each of the FIGS. 5, 6, and 7 embodiments.

Figure 8:
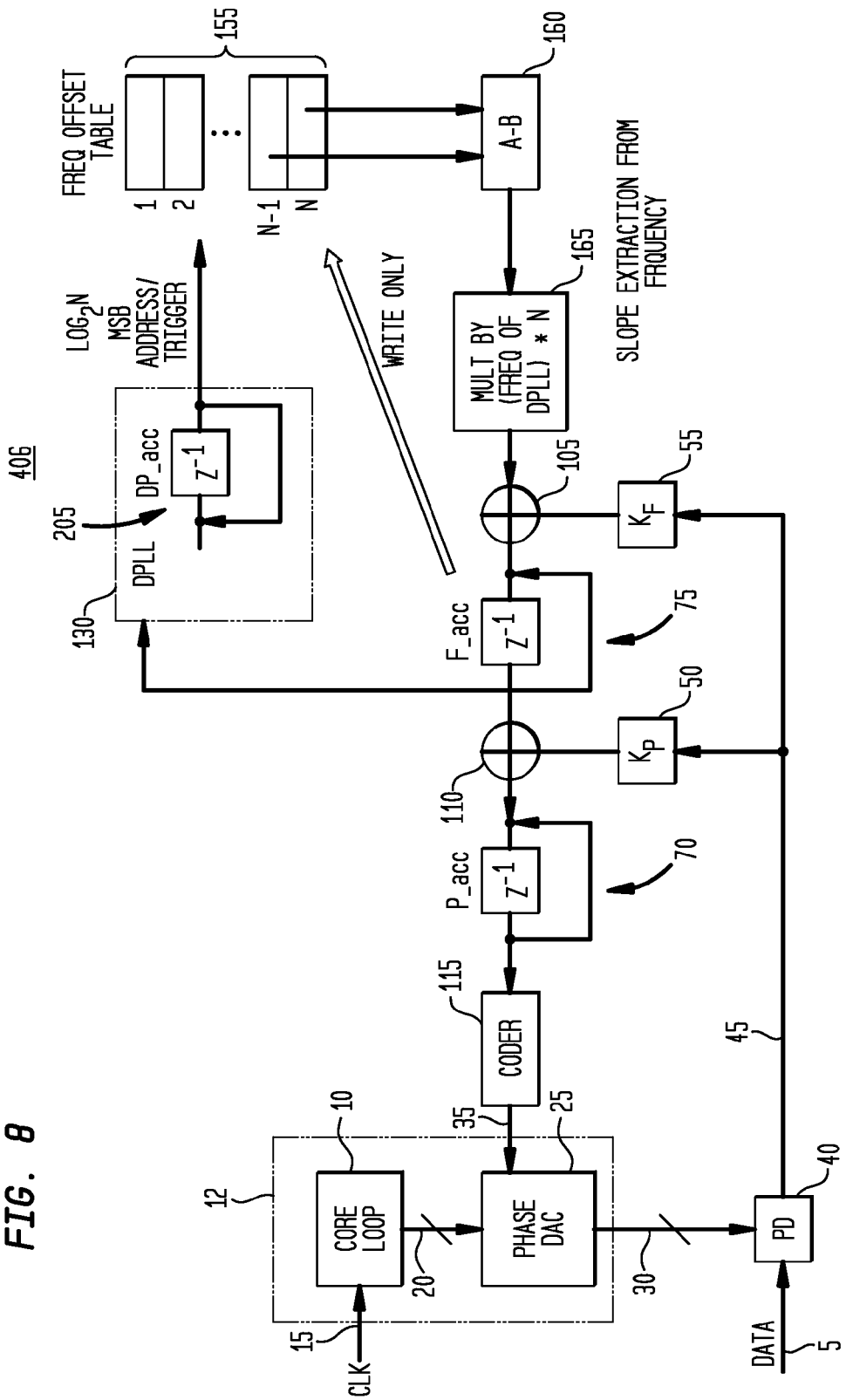
FIG. 8 is a functional block diagram of a clock recovery circuit in accordance with a fourth embodiment of the present system and method.

Referring now to FIG. 8, there is shown a functional block diagram of a clock recovery circuit 406 in accordance with a fourth embodiment of the present system and method. Clock recovery circuit 406 corresponds to clock recover circuit 100 of FIG. 3. The embodiment of FIG. 8 is the same as the embodiment of FIG. 6 with the exceptions that the embodiment of FIG. 8 does not include a multiplication block 125, accumulator 135 and frequency offset derivative table 140, but rather, includes a frequency offset table 155, a subtractor 160 and a multiplier 165. The frequency offset table is a data table that is stored in a memory of the circuit. It includes "N" entries, one for each segment of the frequency offset waveform. The "N" entries are the respective last-known-estimates of the frequency offset for the "N" segments of the frequency offset waveform. This stands in contrast to the FIG. 6 embodiment, wherein the "N" entries are the respective last-known-estimates of the derivative of the frequency offset for the "N" segments of the frequency offset waveform. In the FIG. 8 embodiment, the "N" entries are frequency offset values as indicated at the output of the frequency accumulator 75, and they are values as measured at the end of their respective segments. More particularly, each time a segment of the waveform is completed, the frequency offset currently indicated at the output of accumulator 75 is written into the frequency offset table as the segment's corresponding entry. The frequency table entries are used to compute waveform ramp rate estimates for each segment.

In the FIG. 8 embodiment, the waveform ramp rate for a given segment is estimated by subtracting the frequency offset table entry for the immediately preceding segment from the frequency offset table entry for the given segment and multiplying the result by "N" times the frequency of the DPLL. For example, to estimate the ramp rate of the "$N^{th}$" segment, subtractor 160 subtracts the table entry for segment "N−1" from the table entry for segment "N" and multiplier 165 multiplies the result of the subtraction by "N" times the frequency estimated by the DPLL 130. Thereby, a piece-wise linear estimate of the waveform ramp rate is generated.

In an alternative of the FIG. 8 embodiment, a higher order polynomial estimate is generated to estimate the change in the frequency offset over time. In such embodiment, three or more entries in the frequency offset table are used in a "curve-fitting" operation to generate a curve that describes the frequency offset over time. The curve is then used to determine how the frequency offset varies over time. Implementing such a curve-fitting scheme may be desirable for purposes of reducing the number of points required to accurately estimate the frequency offset waveform, or for providing an estimate that is more accurate than a piece-wise estimate for a fixed number of points, particularly if the waveform is known to have a shape that is closely approximated by a polynomial of a given order.

In any event, the entries in the frequency offset table are updated during each iteration or period of the frequency offset waveform. Accordingly, upon completion of a segment the table entry for the segment is updated by overwriting the entry with the current value of accumulator 75. In this manner, the initial table entry for the segment during the following iteration is set equal to the final value of the frequency accumulator during the current iteration. Thereby, the frequency offset estimate for each segment, and therefore the ramp rate estimate for each segment, is improved over time.

It should be noted that the amount of memory required to store the frequency offset table 155 may be reduced by performing a subtraction operation before writing values to the table, e.g. by storing the difference between the current and previous frequency offset estimates instead of storing the current frequency offset estimate. When implemented in this manner, the values stored in the table 155 are average frequency ramp rates. That is, for each segment, the value stored in table 155 is the average ramp rate for the segment. By contrast, the ramp rates stored in table 140 of FIGS. 6 and 7 are instantaneous ramp rates, each stored value corresponding to the ramp rate at the end of the respective segment.

The read/write accesses of the frequency offset table must be synchronized with the frequency offset waveform. Such synchronization is achieved through the use of DPLL 130. As in the case of the embodiments of FIGS. 5-7, the MSBs of the DPLL phase accumulator's binary code are observed to determine when one segment ends and the next segment begins. In the FIG. 8 embodiment, a change in an MSB indicates that the frequency offset value for the ending segment should be written from accumulator 75 to the frequency offset table. Further, the change in an MSB indicates that the frequency offset value for the ending segment should be subtracted from the last-known-estimate for the beginning segment and multiplied by the "N" times the DPLL frequency to generate the ramp rate estimate for the beginning segment.

When the MSBs of the phase accumulator's binary code are to be used to synchronize switching and ramp rate estimate generation, the number of MSBs that must be monitored is related to the number of segments by the following equation: $M = \text{Log}_2 N$ (where "M" is the number of MSBs that must be monitored and "N" is the number of segments).

A respective element in FIG. 8 that also appears in FIGS. 5, 6, and 7 may perform the same function in each of the FIGS. 5, 6, 7, and 8 embodiments.

As these and other variations and combinations of the features discussed above can be utilized without departing from the present invention as defined by the claims, the foregoing description of the one embodiments should be taken by way of illustration rather than by way of limitation of the invention as defined by the claims.

The invention claimed is:

1. A device, comprising:
    circuitry configured to sample a signal arriving at the device according to a recovered clock;
    circuitry configured to generate the recovered clock in a manner dependent on a spread spectrum modulated receiver clock;
    circuitry configured to adjust generation of the recovered clock so as to reduce offset between the recovered clock and the arriving signal, including a circuit configured to produce a control signal based at least in part on three or more periodically updated frequency offset values, corresponding to frequency offset between the recovered clock and the arriving signal, for three or more corresponding time segments of a frequency modulation period.

2. The device of claim 1, where the circuitry configured to generate the recovered clock is operable to generate the recovered clock to have a triangular frequency modulation pattern.

3. The device of claim 1, where the circuitry configured to adjust generation of the recovered clock includes circuitry configured to generate the recovered clock to have a frequency waveform that varies periodically and comprises a first rate of frequency change during a first time segment of a period of the frequency waveform and a second rate of frequency change during a second time segment of the period of the frequency waveform.

4. The device of claim 1, where the circuitry configured to adjust generation of the recovered clock includes a phase locked loop (PLL), and where the PLL is configured to receive and apply different frequency change information at respective times.

5. The device of claim 4, where the PLL is a digital PLL (DPLL), where the different frequency change information comprises respective multi-bit digital values representing respective frequency change, and where the DPLL is configured to receive and apply the multi-bit digital values at respective times to adjust generation of the recovered clock.

6. The device of claim 1, where the signal is a binary signal comprising bits and where the circuitry configured to sample the signal arriving at the device according to the recovered clock includes a data sampler to sample the binary signal to obtain data samples corresponding to respective bit intervals of the binary signal.

7. The device of claim 1, wherein the circuitry configured to adjust generation of the recovered signal includes N circuit elements, each element of the N circuit elements configured to retain periodically updated frequency offset information for a respective segment of N distinct time segments, where N is greater than two.

8. The device of claim 7, wherein the N circuit elements comprise memory elements to store respective values.

9. The device of claim 7, wherein the N circuit elements comprise accumulator circuits configured to accumulate respective rate of change of frequency offset values.

10. A device, comprising:
    circuitry configured to sample a digital signal arriving at the device according to a recovered clock;
    circuitry configured to generate a receiver clock to have spread spectrum modulation;
    circuitry configured to generate the recovered clock dependent on the receiver clock;
    circuitry configured to detect offset between the recovered clock and timing of logic value boundary transitions between respective pairs of digital values of the arriving digital signal; and
    circuitry configured to adjust generation of the recovered clock so as to reduce the offset, including a circuit configured to produce a control signal based at least in part on three or more periodically updated frequency offset values, corresponding to frequency offset between the recovered clock and the arriving signal, for three or more corresponding time segments of a frequency modulation period.

11. The device of claim 10, where the circuitry configured to generate the receiver clock to have spread spectrum modulation is operable to generate the receiver clock to have a spread spectrum modulation pattern that is a triangular modulation pattern.

12. The device of claim 10, where the circuitry configured to generate the receiver clock includes circuitry configured to generate the receiver clock to have a frequency-versus-time waveform that varies periodically and that represents a first rate of frequency change during a first segment of each period of the frequency-versus-time waveform and a second rate of frequency change during a second segment of each period of the frequency-versus-time waveform.

13. The device of claim 10, where:
the circuitry configured to adjust generation of the recovered clock so as to reduce the offset is to use first and second frequency change control values to reduce the offset; and
the circuitry configured to adjust generation of the recovered clock includes
circuitry configured to update respective first and second frequency change control values to generate updated values, and
circuitry configured to write back the updated values into at least one register so as to overwrite respective the first and second frequency change control values.

14. The device of claim 10, where:
the circuitry configured to adjust generation of the recovered clock includes a digital phase locked loop (DPLL); and
the DPLL is configured to receive and apply different frequency change information, each represented by at least one respective multi-bit digital value, at respective times.

15. The device of claim 10, where:
the device is a first device and is operable for use with a second device;
the timing of logic value boundary transitions is dependent on a substantially constant data transmission frequency of the second device; and
the recovered clock is generated in a manner so as to reduce frequency offset of the sampling clock relative to the substantially constant transmission frequency.

16. The device of claim 10, wherein the circuitry configured to adjust generation of the recovered clock includes N circuit elements, each element of the N circuit elements configured to retain periodically updated frequency offset information for a respective segment of N distinct time segments, where N is greater than two.

17. The device of claim 16, wherein the N circuit elements comprise memory elements to store respective values.

18. The device of claim 16, wherein the N circuit elements comprise accumulator circuits to accumulate respective rate of change of frequency offset values.

19. A device, comprising:
means for sampling a digital signal arriving at the device according to a recovered clock;
means for generating the recovered clock in a manner dependent on a spread spectrum modulated receiver clock; and
means for reducing frequency offset between the recovered clock and the arriving digital signal, including means for producing a control signal based at least in part on three or more periodically updated frequency offset values, corresponding to frequency offset between the recovered clock and the arriving signal, for three or more corresponding time segments of a frequency modulation period.

20. The device of claim 19, wherein the means for producing a control signal includes N update means, each configured to retain periodically updated frequency offset information for a respective segment of N distinct time segments, where N is greater than two.

* * * * *